United States Patent
Yamashita

(10) Patent No.: US 8,241,960 B2
(45) Date of Patent: Aug. 14, 2012

(54) SEMICONDUCTOR DEVICE MANUFACTURING EQUIPMENT AND SEMICONDUCTOR DEVICE MANUFACTURING METHOD

(75) Inventor: Nobuo Yamashita, Kumamoto (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/959,779

(22) Filed: Dec. 3, 2010

(65) Prior Publication Data
US 2011/0136323 A1 Jun. 9, 2011

(30) Foreign Application Priority Data
Dec. 4, 2009 (JP) ................... 2009-276699

(51) Int. Cl.
H01L 21/50 (2006.01)
H01L 21/48 (2006.01)
H01L 21/44 (2006.01)
H01L 21/78 (2006.01)
H01L 21/46 (2006.01)

(52) U.S. Cl. ........ 438/113; 438/106; 438/121; 438/460; 438/462; 438/464; 257/E21.214; 257/E21.238; 257/E21.499; 257/E21.599

(58) Field of Classification Search ........... 257/E21.214, 257/E21.238, E21.499, E21.599
See application file for complete search history.

(56) References Cited

U.S. PATENT DOCUMENTS

| | | | |
|---|---|---|---|
| 6,365,438 B1 | 4/2002 | Ishida et al. | |
| 2003/0127428 A1* | 7/2003 | Fujii et al. | 216/65 |
| 2006/0148211 A1* | 7/2006 | Iwasaki et al. | 438/462 |
| 2009/0174023 A1* | 7/2009 | Takahashi et al. | 257/458 |
| 2009/0283760 A1* | 11/2009 | Fujii | 257/43 |
| 2010/0248450 A1* | 9/2010 | Saeki | 438/462 |
| 2010/0308464 A1* | 12/2010 | Tsutsue et al. | 257/758 |

FOREIGN PATENT DOCUMENTS
JP 11-135557 5/1999

OTHER PUBLICATIONS

Tsutomu, English Machine Translated of JP patent No. JP11135557, May 21, 1999; (Machine Translated Dec. 30, 2011).*

* cited by examiner

*Primary Examiner* — Mohsen Ahmadi
(74) *Attorney, Agent, or Firm* — Young & Thompson

(57) ABSTRACT

Semiconductor device manufacturing equipment in which in the process of dividing a substrate into individual semiconductor devices using a dicing blade, the possibility of an odd piece flying off a supporting member is prevented. A supporting member supports a substrate for semiconductor devices on one surface thereof. A dicing blade dices the substrate supported by the supporting member along dicing lines provided on the substrate to divide the substrate into a plurality of semiconductor devices. In a plan view, the edge of the supporting member's surface supporting the substrate overlaps a semiconductor device located at an outermost position of the substrate and lies inside a dicing line at an outermost position of the substrate.

13 Claims, 4 Drawing Sheets

SEMICONDUCTOR DEVICE MANUFACTURING EQUIPMENT AND SEMICONDUCTOR DEVICE MANUFACTURING METHOD

CROSS-REFERENCE TO RELATED APPLICATIONS

The disclosure of Japanese Patent Application No. 2009-276699 filed on Dec. 4, 2009 including the specification, drawings and abstract is incorporated herein by reference in its entirety.

FIELD OF THE INVENTION

The present invention relates to semiconductor device manufacturing equipment which manufactures semiconductor devices by dividing a substrate, more particularly a substrate resin-encapsulated by a mold array process (hereinafter referred to as MAP), into individual pieces using a dicing blade and a method for manufacturing a semiconductor device.

BACKGROUND OF THE INVENTION

A semiconductor device manufacturing method based on MAP is as follows: a semiconductor chip is bonded to each of plural wiring boards set on a substrate and the electrodes of the semiconductor chips are coupled (bonded) to the electrodes of the wiring boards by metal wires or a flip-chip technique and the semiconductor chips and wiring boards are collectively encapsulated with sealing resin, then the substrate and sealing resin are diced into individual wiring boards using a dicing blade. In the process of dicing the substrate to divide it into individual semiconductor devices using a dicing blade, the edge portions of the substrate become useless odd pieces since they cannot be used for semiconductor devices. For example, Japanese Unexamined Patent Publication No. Hei 11 (1999)-135557 discloses that a substrate's portions supposed to become such odd pieces are supported by supporting members.

SUMMARY OF THE INVENTION

As a result of investigation by the present inventors, it has been found that when a substrate's portion supposed to become an odd piece is supported by a supporting member, in the process of dicing the substrate into individual semiconductor devices using a dicing blade, the odd piece may fly off the supporting member and fall on a semiconductor device. The semiconductor device on which the odd piece has fallen may become a defective device.

According to one aspect of the invention, there is provided semiconductor device manufacturing equipment which includes a supporting member and a dicing blade which dices a substrate supported on one surface of the supporting member along dicing lines to divide the substrate into a plurality of semiconductor devices, wherein in a plan view, an edge of the one surface of the supporting member overlaps one of the semiconductor devices, located at an outermost position of the substrate, and lies inside one of the dicing lines, located at an outermost position of the substrate.

While dicing is being performed, a portion of the substrate which is supposed to become an odd piece is pressed toward the supporting member by the dicing blade. If the supporting member exists under the odd portion, the supporting member gives the odd portion a reactive force against the force which the odd portion receives from the dicing blade. Therefore, when that portion is cut off the substrate and becomes an odd piece, it may fly off the supporting member due to the reactive force given by the supporting member. By contrast, according to the present invention, an edge of the supporting member which supports the substrate lies inside a dicing line at an outermost position of the substrate. In other words, the supporting member does not exit under the portion of the substrate which is supposed to become an odd piece. This prevents the possibility of the odd piece flying off the supporting member.

According to another aspect of the invention, there is provided a method for manufacturing a semiconductor device which includes the steps of fixing a substrate on one surface of a supporting member and dicing the substrate along dicing lines provided on the substrate using a dicing blade to divide the substrate into a plurality of semiconductor devices, wherein in a plan view, an edge of the one surface of the supporting member overlaps one of the semiconductor devices, located at an outermost position of the substrate, and lies inside one of the dicing lines, located at an outermost position of the substrate.

According to the present invention, in the process of dividing the substrate into individual semiconductor devices using a dicing blade, the possibility of an odd piece flying off the supporting member is prevented.

DETAILED DESCRIPTION OF THE PREFERRED EMBODIMENTS

Figure 1:
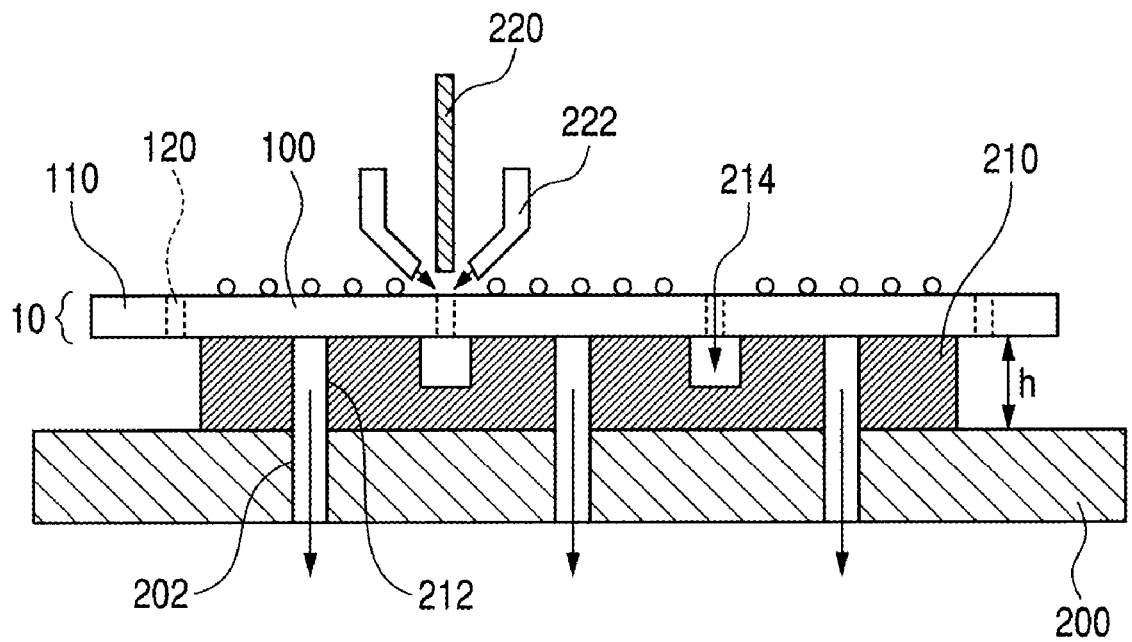
FIG. 1 is a sectional view showing the structure of semiconductor device manufacturing equipment according to an embodiment of the present invention.

Next, the preferred embodiments of the present invention will be described referring to the accompanying drawings. In all the drawings, elements with like functions are designated by like reference numerals and repeated descriptions of such elements are omitted.

Figure 2:
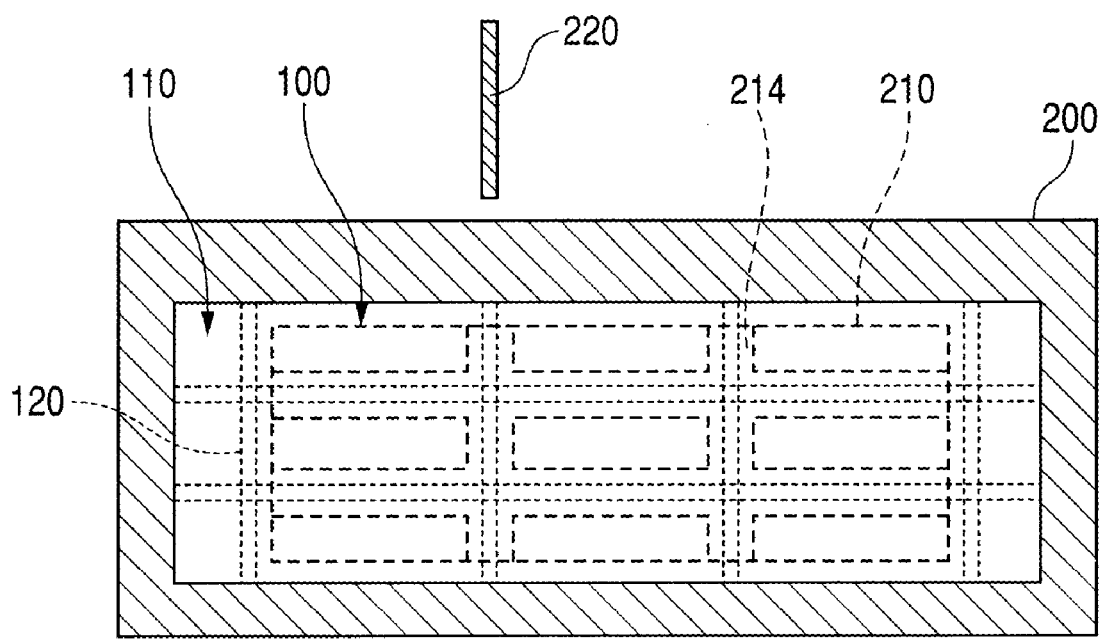
FIG. 2 is a plan view of the semiconductor device manufacturing equipment shown in FIG. 1.

FIG. 1 is a sectional view showing the structure of semiconductor device manufacturing equipment according to an embodiment of the present invention. FIG. 2 is a plan view of the semiconductor device manufacturing equipment shown in FIG. 1. The semiconductor device manufacturing equipment includes a supporting member 210 and a dicing blade 220. The supporting member 210 supports a substrate 10 for semiconductor devices on one surface thereof. The dicing blade 220 dices the substrate 10 supported by the supporting member 210 along dicing lines 120 of the substrate 10 to divide the substrate 10 into a plurality of semiconductor devices 100. In a plan view, an edge of the surface of the supporting member 210 supporting the substrate 10 overlaps a semiconductor device 100 located at an outermost position of the substrate 10 and lies inside a dicing line 120 located at an outermost position of the substrate 10.

The supporting member 210 may be made of resin such as rubber and is placed on a metal table base 200. The supporting member 210 has a plurality of exhaust holes 212 and the table base 200 also has a plurality of exhaust holes 202. The exhaust holes 212 overlap the exhaust holes 202, in which an exhaust hole 212 and an exhaust hole 202 are provided for each of the semiconductor devices 100. The exhaust holes 212 and 202 bring the substrate 10 and the individual semiconductor devices 100 after dicing into contact with the above-mentioned surface of the supporting member 210 by vacuum suction. However, an odd portion 110 of the substrate 10 is not subjected to vacuum suction and not supported by the supporting member 210. The height of the above-mentioned surface of the supporting member 210, h, is larger than the thickness of the substrate 10.

The supporting member 210 has grooves 214. The grooves 214 extend along dicing lines 120 and are wider than the dicing lines 120. The grooves 214 are intended to prevent interference between the dicing blade 220 and the supporting member 210 in the process of dicing the substrate 10 along the dicing lines 120

As shown in FIG. 1, the semiconductor device manufacturing equipment includes a dicing water feeder 222. The dicing water feeder 222 moves together with the dicing blade 220 and supplies dicing water to a portion of the substrate 10 which is being cut by the dicing blade 220. This means that the substrate 10 receives not only the force of the dicing blade 220 but also the force of dicing water.

For example, the substrate 10 includes wiring boards on which semiconductor chips are mounted and encapsulated. The semiconductor device manufacturing method according to this embodiment is based on MAP. More specifically, the method is as follows. A semiconductor chip is fixed on each of plural wiring boards set on the substrate 10, for example, by bonding. Then the electrodes of the semiconductor chips are coupled to the electrodes of the wiring boards. This coupling process may be performed by bonding with metal wires or a flip-chip technique. Then the semiconductor chips and wiring boards are collectively encapsulated with sealing resin before the substrate 10 and sealing resin are diced into individual wiring boards using the dicing blade 220.

Figure 3:
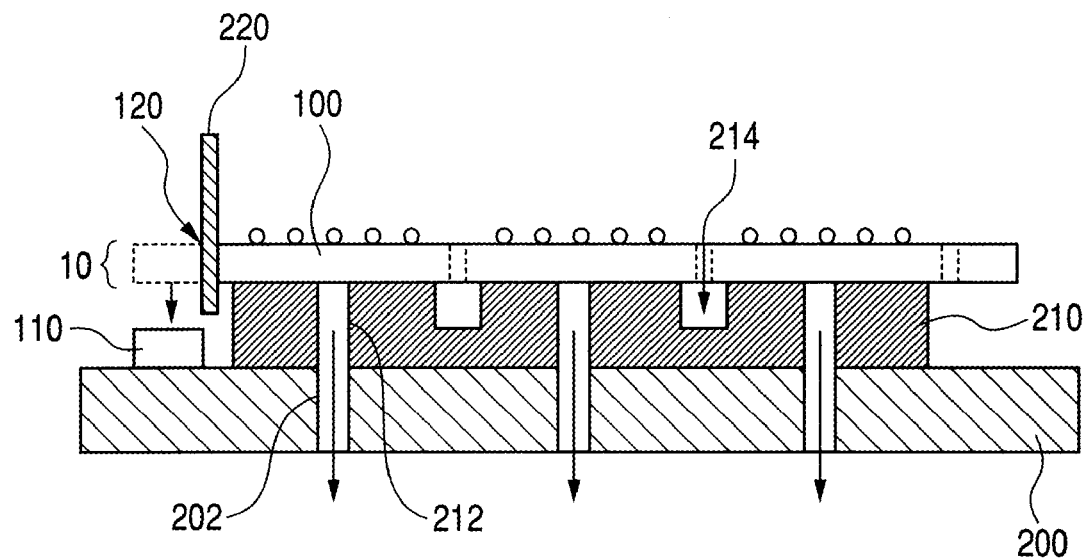
FIG. 3 is a sectional view showing how the substrate is diced by the semiconductor device manufacturing equipment shown in FIGS. 1 and 2.
Figure 4:
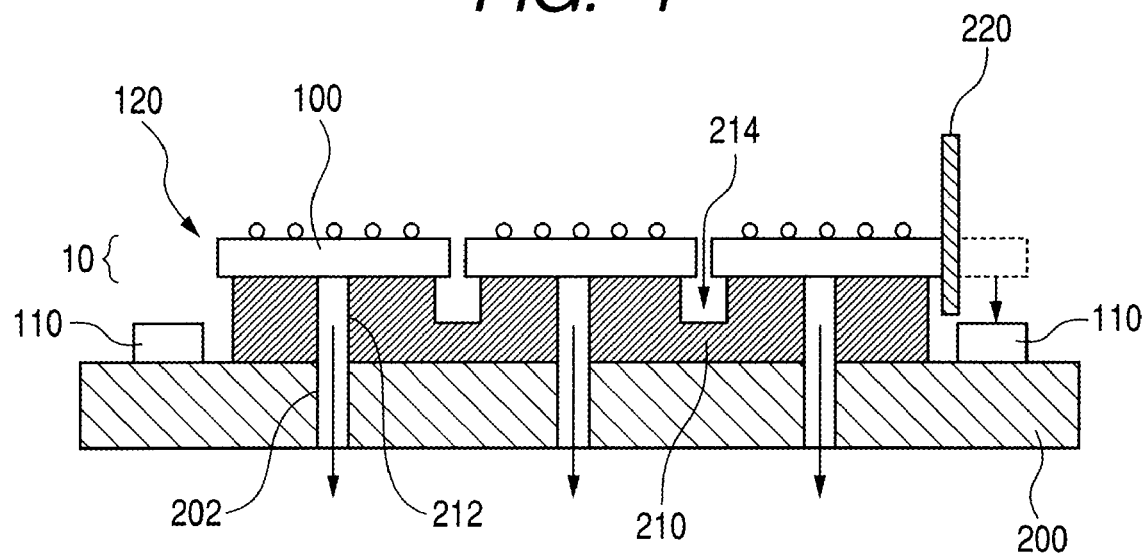
FIG. 4 is a sectional view showing how the substrate is diced by the semiconductor device manufacturing equipment shown in FIGS. 1 and 2.

FIGS. 3 and 4 are sectional views showing how the substrate 10 is diced by the semiconductor device manufacturing equipment shown in FIGS. 1 and 2. As shown in FIGS. 3 and 4, when the substrate 10 is diced, the dicing blade 220 moves along a dicing line 120 to cut the substrate 10. When the substrate 10 is cut along an outermost dicing line 120, the edge portion of the substrate 10 becomes an odd piece 110. In this embodiment, the supporting member 210 does not exist under a portion of the substrate 10 which is supposed to become an odd piece 110, as mentioned earlier. Therefore, the odd piece 110 falls.

Figure 5:
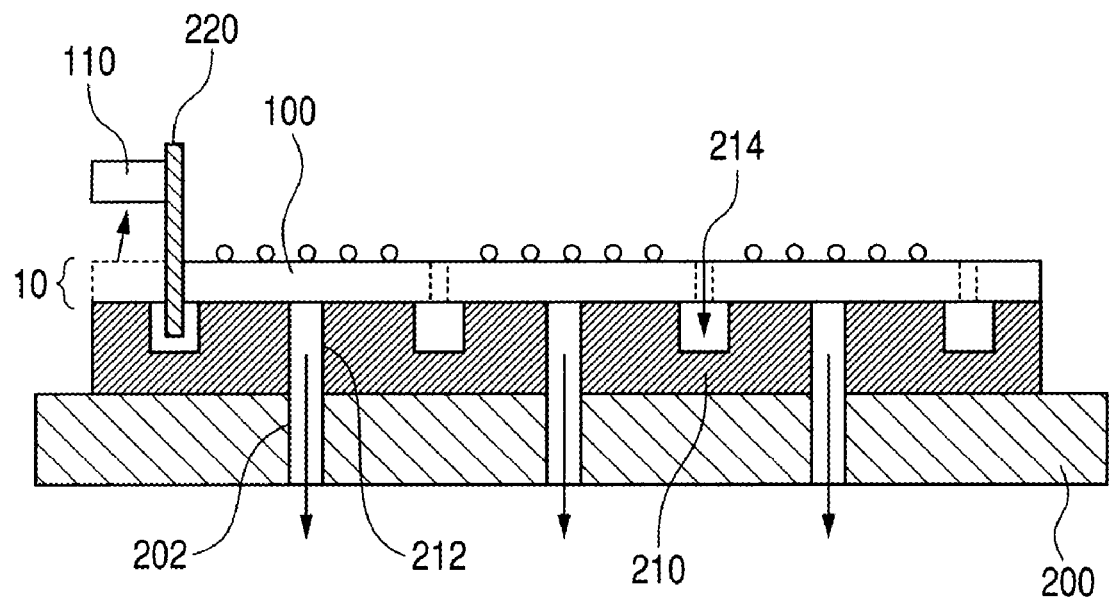
FIG. 5 shows a case that a portion of the substrate which is supposed to become an odd piece is supported by a supporting member.

FIG. 5 shows a case that the portion of the substrate 10 which is supposed to become the odd piece 110 is supported by the supporting member 210. During dicing, the portion of the substrate 10 which is supposed to become the odd piece 110 is pressed downward by the dicing blade 220. If the supporting member 210 exists under the portion supposed to become the odd piece 110, the supporting member 210 gives the portion 110 a reactive force against the force which the portion 110 receives from the dicing blade 220. Therefore, when the portion 110 is separated from the rest of the substrate 10, there is a possibility that due to the reactive force given by the supporting member 210, the odd piece (which was the odd portion) 110 may fly off the supporting member 210 and fall on a portion of the substrate 10 where a semiconductor device 100 is formed. If that happens, the semiconductor device 100 may be damaged, resulting in a decline in the yield rate for semiconductor devices 100. When dicing water is supplied from the dicing water feeder 222 as in this embodiment, the force of dicing water is also applied to the odd piece 110, so the odd piece 110 is more likely to fly to a portion of the substrate 10 where a semiconductor device 100 is formed.

Therefore, according to this embodiment, the possibility of an odd piece 110 damaging a semiconductor device 100 is lower than when a portion of the substrate 10 which is supposed to become an odd piece 110 is supported by the supporting member 210. This improves the yield rate for semiconductor devices 100. This effect is particularly large when the height of the edge of one surface (supporting surface) of the supporting member 210 is larger than the thickness of the substrate 10.

In this embodiment, cutting along an outermost one of the dicing lines 120 may be made at any time.

Figure 6:
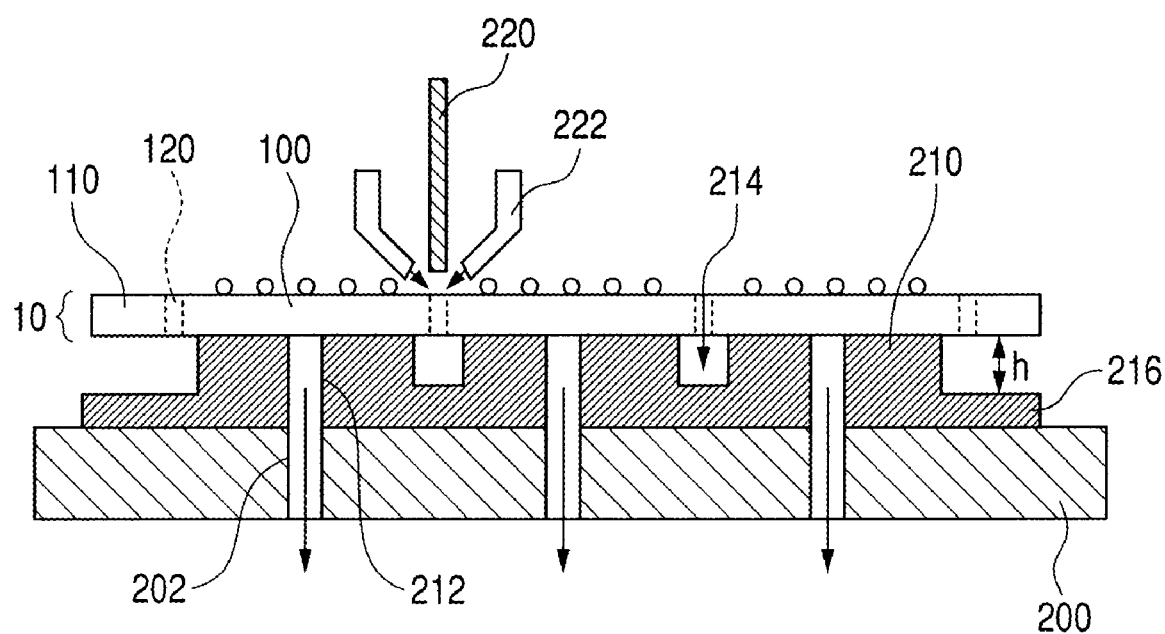
FIG. 6 is a sectional view showing the structure of semiconductor device manufacturing equipment according to a second embodiment of the present invention.

FIG. 6 is a sectional view showing the structure of semiconductor device manufacturing equipment according to a second embodiment of the present invention. This semiconductor device manufacturing equipment is the same as the semiconductor device manufacturing equipment according to the first embodiment except that the lower part 216 of the supporting member 210 on the lateral side thereof extends outward. In this embodiment, the height of one surface (supporting surface) of the supporting member 210, h, which is determined with reference to one surface of the lower part 216, is larger than the thickness of the substrate 10.

This embodiment also brings about the same advantageous effect as the first embodiment.

Figure 7:
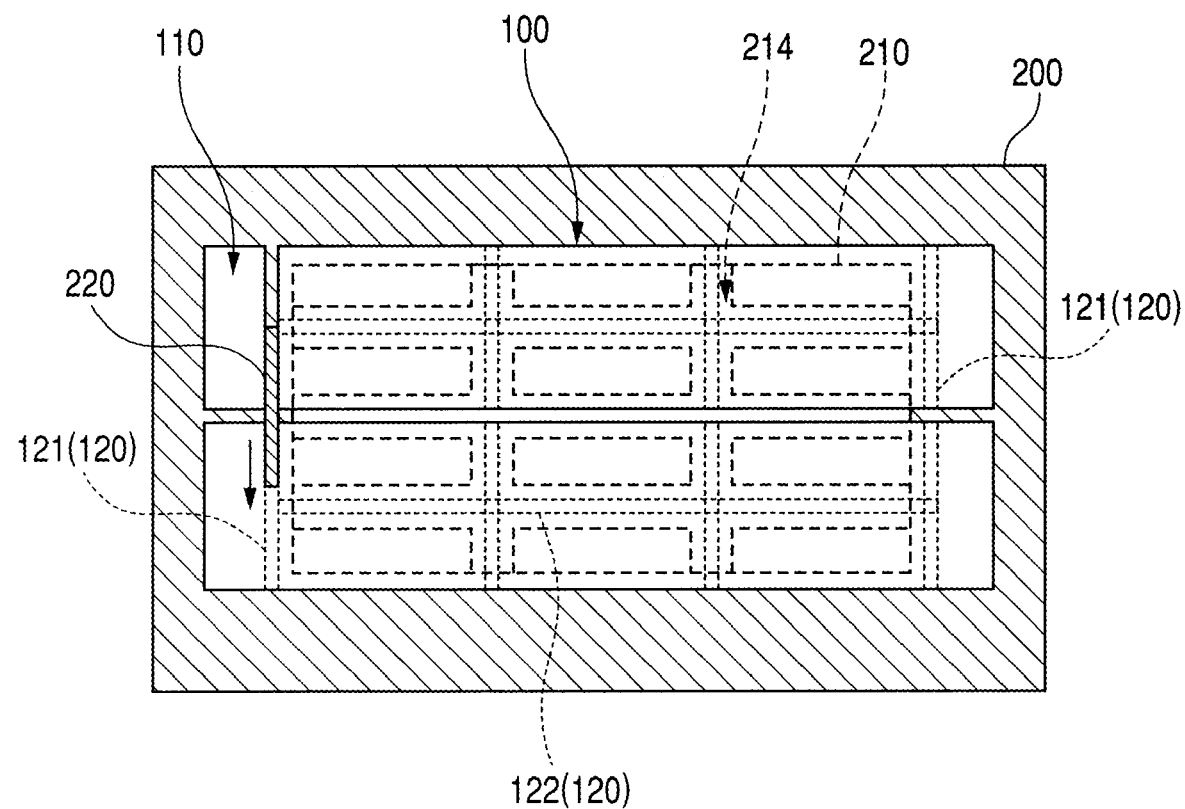
FIG. 7 is a plan view showing a method for manufacturing a semiconductor device according to a third embodiment of the present invention.

FIG. 7 is a plan view showing a method for manufacturing a semiconductor device according to a third embodiment of the present invention. The method according to this embodiment is the same as the manufacturing methods according to the first and second embodiments except that the order in which cutting along dicing lines are made is determined so as to make the width of the odd portion (piece) 110 an integral multiple (more than 1) of the width of the semiconductor device 100.

More specifically, on the substrate 10 there are provided dicing lines 121 for cutting the odd portions 110 off the substrate 10 and dicing lines 122 perpendicular to the dicing lines 121. There should be at least three dicing lines 122. Given a prescribed number of dicing lines 122, cutting is first made, for example, along every other dicing line 122, then cutting is made along the dicing lines 121. As a consequence, the width of each odd piece 110 should be an integral multiple (more than 1) of the width of the semiconductor device 100.

The third embodiment also brings about the same advantageous effect as the first embodiment. Since the width of each odd piece 110 is twice or more as large as the width of the semiconductor device 100, the weight of the odd piece 110 is increased. Consequently, the odd piece 110 is more likely to fall.

Preferred embodiments of the present invention have been so far described in reference to the accompanying drawings. However, they are just illustrative and not restrictive and the invention may be embodied in other various ways.

What is claimed is:

1. A semiconductor device manufacturing equipment, comprising:
    a supporting member having a plurality of exhaust holes and a plurality of grooves; and
    a dicing blade which dices a substrate supported on one surface of the supporting member along dicing lines to divide the substrate into a plurality of semiconductor devices, the one surface including a wafer area and an odd piece area,
    wherein in a plan view, an edge of the one surface of the supporting member overlaps one of the semiconductor devices, located at an outermost position of the substrate, and lies inside one of the dicing lines, located at an outermost position of the substrate, a height of an edge of the one surface of the supporting member is larger than a thickness of the substrate, and the plurality of grooves are provided to prevent interference between the dicing blade and the supporting member.

2. The semiconductor device manufacturing equipment according to claim 1,
    wherein the supporting member includes a first part having the one surface and a second part.

3. The semiconductor device manufacturing equipment according to claim 2,
    wherein the substrate has a first surface comprising a first area and a second area located at an outside of the first area such that the first area of the substrate contacts the one surface of the supporting member and the second area of the substrate opposes the second part of the supporting member with a space between the second area of the substrate and the second part of the supporting member.

4. A method for manufacturing a semiconductor device, comprising:
    providing a substrate having a wiring substrate, a plurality of semiconductor chips mounted on the wiring substrate, and a sealing resin formed over the plurality of semiconductor chips and the wiring substrate, the substrate having a first surface comprising a first area and a second area located at an outside of the first area;
    providing a supporting member having a first part having a one surface and a second part, a plurality of groves being formed on one surface of the supporting member;
    fixing the substrate on the supporting member such that the first area of the substrate contacts the one surface of the supporting member and the second area of the substrate opposes the second part of the supporting member with a space between the second area of the substrate and the second part of the supporting member; and
    dicing the substrate along dicing lines provided on the substrate using a dicing blade to divide the substrate into a plurality of semiconductor devices from the first area of the substrate and the second part of the supporting member, and the plurality of grooves are overlapped with each of the dicing lines of the substrate.

5. The method for manufacturing a semiconductor device according to claim 4, wherein a height of the edge of the one surface of the supporting member is larger than a thickness of the substrate.

6. The method for manufacturing a semiconductor device according to claim 5,
    wherein the dicing lines include first dicing lines for cutting an odd portion from the substrate and three or more second dicing lines perpendicular to the first dicing line; and
    wherein, after cutting is made along every a fixed number of second dicing lines, cutting is made along the first dicing lines.

7. The method for manufacturing a semiconductor device according to claim 4,
    wherein the dicing lines include first dicing lines for cutting an odd portion from the substrate and three or more second dicing lines perpendicular to the first dicing line; and
    wherein, after cutting is made along every a fixed number of second dicing lines, cutting is made along the first dicing lines.

8. The method for manufacturing a semiconductor device according to claim 4,
    wherein the second portion of the substrate is not supported by the supporting member.

9. The method for manufacturing a semiconductor device according to claim 4,
    wherein the dicing the substrate comprises:
    dicing the sealing resin formed over the plurality of semiconductor chips and the wiring substrate.

10. The method for manufacturing a semiconductor device according to claim 4,
    wherein the first region of the supporting member is made of resin.

11. The method for manufacturing a semiconductor device according to claim 4,
    wherein a plurality of exhaust holes are formed on the supporting member, in which an exhaust hole are provided for each of the semiconductor devices, the exhaust holes bring the individual semiconductor devices after dicing into contact with the one surface of the supporting member by vacuum suction.

12. The method for manufacturing a semiconductor device according to claim 11,
    wherein the plurality of exhaust holes are formed between the grooves.

13. The method for manufacturing a semiconductor device according to claim 4,
    wherein the one surface has a wafer area and an odd piece area.

* * * * *